(12) United States Patent
Setta

(10) Patent No.: US 11,769,744 B2
(45) Date of Patent: Sep. 26, 2023

(54) SEMICONDUCTOR DEVICE AND METHOD FOR MANUFACTURING THE SAME

(71) Applicant: Kioxia Corporation, Tokyo (JP)

(72) Inventor: Yuji Setta, Kuwana (JP)

(73) Assignee: Kioxia Corporation, Tokyo (JP)

( * ) Notice: Subject to any disclaimer, the term of this patent is extended or adjusted under 35 U.S.C. 154(b) by 103 days.

(21) Appl. No.: 17/468,173

(22) Filed: Sep. 7, 2021

(65) Prior Publication Data
US 2022/0302057 A1    Sep. 22, 2022

(30) Foreign Application Priority Data

Mar. 19, 2021    (JP) ................................. 2021-046077

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/00* | (2006.01) | |
| *H01L 25/065* | (2023.01) | |

(52) U.S. Cl.
CPC .............. *H01L 24/08* (2013.01); *H01L 24/03* (2013.01); *H01L 24/05* (2013.01); *H01L 24/80* (2013.01); *H01L 25/0657* (2013.01); *H01L 2224/05571* (2013.01); *H01L 2224/08145* (2013.01); *H01L 2224/80001* (2013.01)

(58) Field of Classification Search
CPC combination set(s) only.
See application file for complete search history.

(56) References Cited

U.S. PATENT DOCUMENTS

| | | | |
|---|---|---|---|
| 9,799,587 B2 * | 10/2017 | Fujii | ..................... H01L 23/498 |
| 2011/0298097 A1 | 12/2011 | Sueyoshi et al. | |
| 2020/0335513 A1 * | 10/2020 | Morozumi | ............. G11C 16/32 |
| 2021/0090987 A1 * | 3/2021 | Okano | .................. H01L 23/528 |

FOREIGN PATENT DOCUMENTS

| | | |
|---|---|---|
| JP | 2011-258687 A | 12/2011 |
| JP | 5919653 B2 | 5/2016 |
| JP | 2019-47043 A | 3/2019 |
| JP | 2019-114595 A | 7/2019 |
| JP | 2020-102485 A | 7/2020 |
| JP | 2020-178010 A | 10/2020 |

* cited by examiner

*Primary Examiner* — Niki H Nguyen
(74) *Attorney, Agent, or Firm* — Oblon, McClelland, Maier & Neustadt, L.L.P.

(57) ABSTRACT

A semiconductor device includes a first substrate having a first surface, and a second substrate having a second surface in contact with the first surface. The first substrate includes a first circuit, a first electrode having a first connection end on the first surface, and a first auxiliary electrode having a second connection end on the first surface. The first electrode is connected to the first circuit inside the first substrate, and the first auxiliary electrode is connected to the first electrode. The second substrate includes a second circuit and a second electrode having a third connection end on the second surface. The second electrode is connected to the second circuit. The third connection end is connected directly with the first connection end and the second connection end. The second electrode is connected directly with the first electrode and through the first auxiliary electrode to the first electrode.

16 Claims, 11 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2021-046077, filed Mar. 19, 2021, the entire contents of which are incorporated herein by reference.

BACKGROUND

Technical Field

Embodiments described herein relate generally to a semiconductor device and a method for manufacturing the same.

Related Art

In some semiconductor devices, a substrate has a bonded structure which includes a first substrate and a second substrate which are bonded to each other. The first substrate has a first bonded surface, a first circuit and electrodes on the first bonded surface. The second substrate has a second bonded surface, a second circuit and electrodes on the second bonded surface. The first and second circuits are electrically connected to each other via the electrodes on the first and second bonded surfaces.

High density integration of the circuits needs reduction in size of those electrodes on the bonded surfaces. This electrode size reduction will further need a certain high degree of planarity and high bonding accuracy in bonding process for ensuring adequate electrical conductions between the first and second electrodes. Inadequate planarity and/or bonding accuracy in bonding process can result in inadequate conduction between the electrodes at the bonded surfaces. Inadequate conduction can increase resistance at the bonded surfaces and inadequate electrical conduction between the first and second circuits.

DETAILED DESCRIPTION

Figure 1:
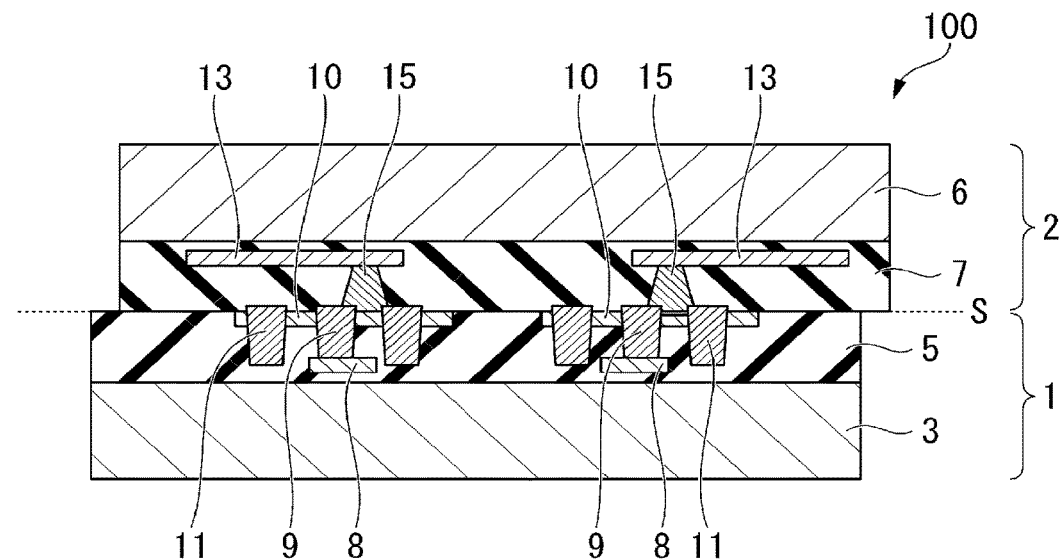
FIG. 1 is a partial cross-sectional view showing a semiconductor device including a bonded substrate including a first substrate and a second substrate according to a first embodiment.

In some embodiments, a semiconductor device may include, but is not limited to, a first substrate and a second substrate. The first substrate has a first surface. The second substrate has a second surface that is in contact with the first surface of the first substrate. The first and second substrate are bonded together. The first and second surfaces of the first and second substrates are first and second bonded surfaces. The first substrate includes a first circuit, a first electrode having a first connection end on the first surface, and a first auxiliary electrode having a second connection end on the first surface. The first auxiliary electrode is around the first electrode. The first electrode is connected to the first circuit inside the first substrate. The first auxiliary electrode is connected to the first electrode inside the first substrate. The second substrate includes a second circuit and a second electrode having a third connection end on the second surface. The second electrode is connected to the second circuit inside the second substrate. The third connection end of the second electrode is connected directly with the first connection end of the first electrode and the second connection end of the first axially electrode. The second electrode is connected directly with the first electrode and connected through the first auxiliary electrode to the first electrode.

Some embodiments will be described hereinafter with reference to the drawings.

In the following descriptions, structures having the same or similar functions are designated by the same reference numerals. Then, duplicate descriptions of the constitutions may be omitted. In the specification, the term "connection" is not limited to a case of physical connection, and also includes a case of electrical connection. In the specification, the term "adjacent" is not limited to a case of being adjacent to each other, but includes a case in which another element is present between two elements. In the specification, "xx is provided on yy" is not limited to a case in which xx is in contact with yy, but also includes a case in which another member is interposed between xx and yy. In the specification, the terms "parallel" and "orthogonal" also include cases of "substantially parallel" and "substantially orthogonal".

Further, an X direction, a Y direction, and a Z direction are defined first. The X direction and the Y direction are directions along a surface of a substrate which will be described later. The Y direction is a direction which intersects (for example, is orthogonal to) the X direction. The Z direction is a direction which intersects (for example, is orthogonal to) the X direction and the Y direction, and is a thickness direction of the substrate. In the specification, a "+Z direction" may be referred to as "upward" and a "−Z direction" may be referred to as "downward". The +Z direction and the −Z direction are 180° different from each other. However, these expressions are for convenience only and do not identify a direction of gravity.

First Embodiment

FIG. 1 is a cross-sectional view of a semiconductor device 100 according to the first embodiment. The semiconductor device 100 may be, for example, a non-volatile semiconductor storage device such as NAND flash memories. The semiconductor device 100 may be a three-dimensional memory having first and second substrates bonded together. The first substrate may be a circuit substrate 1 on which a circuit such as a CMOS circuit. The second substrate may be an array substrate 2 on which a memory circuit is provided. The circuit substrate 1 is an example of the first substrate. The array substrate 2 is an example of the second substrate. The first substrate 1 and the second substrate 2 are bonded to each other at bonded surfaces S. The first substrate 1 serves as a control circuit such as a logic circuit which controls operations in the second substrate 2. FIG. 1 shows that the second substrate 2 is disposed on the first substrate 1. In FIG. 1, although the array substrate 2 is shown to have a second substrate body 6 which will be described later, the second substrate body 6 may be removed off, and the second substrate may be formed using only a second insulating layer 7.

The first substrate 1 has a first substrate body 3 which is a semiconductor substrate, and a first insulating layer 5 on one surface of the first substrate body 3, and in FIG. 1, the first insulating layer 5 is shown in a state in which it faces upward and is horizontally disposed. The second substrate has the second substrate body 6 which is a semiconductor substrate, and the second insulating layer 7 formed on one surface of the second substrate body 6, and in FIG. 1, the second insulating layer 7 is shown in a state in which it faces downward and is horizontally disposed.

In FIG. 1, an upper surface of the first insulating layer 5 of the first substrate 1 and a lower surface of the second insulating layer 7 of the second substrate 2 are in contact with each other, and the upper surface of the first insulating layer 5 and the lower surface of the second insulating layer 7 are formed as bonded surfaces S.

A plurality of first circuits (CMOS circuits) 8 and a plurality of first electrodes 9 are provided inside the first insulating layer 5 in the first substrate 1. Each of the first circuits (CMOS circuits) 8 may include driving elements such as transistors. The first electrodes 9 connected to the first circuit 8 as conductive vias. The first electrodes 9 may have a particular shape such as a generally columnar shape. The plurality of first circuits 8 are arranged in the first substrate 1 at predetermined intervals, but FIG. 1 shows only two adjacent ones of the first circuits 8 at a predetermined interval on the left and right as a representative example.

Further, although a plurality of electrodes are connected to the first circuit 8, in FIG. 1, only one first electrode 9 is shown, and illustrations of the other electrodes are omitted.

The first electrode 9 extends through the first insulating layer 5 in the thickness direction (the Z direction) of the first insulating layer 5 from a connection position with the first circuit 8. The first electrode 9 has a connection end 9a as an upper end that extends to the vicinity of the upper surface (the bonded surface S) of the first insulating layer 5. The first electrode 9 may be formed of a metal such as copper in a columnar shape.

The first insulating layer 5 may have a multi-layered structure including a silicon oxide film and a silicon nitride film, for example.

Figure 2:
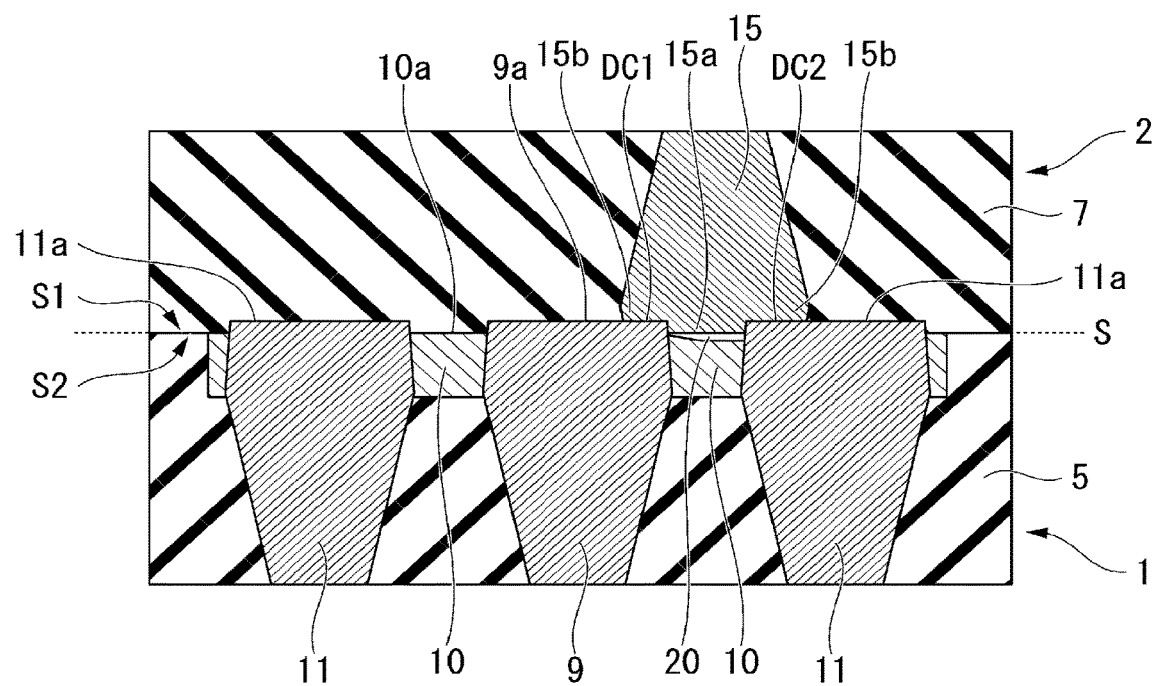
FIG. 2 is a partially enlarged cross-sectional view showing a bonding portion of the bonded substrate shown in FIG. 1.

As shown in FIG. 2, a connection pad 10 is provided in a region near the upper surface of the first insulating layer 5. The connection pad 10 is exposed on the upper surface of the first insulating layer 5 and connected to the first electrode 9. The connection pad 10 is embedded in the first insulating layer 5, except for a bonded surface 10a of the connection pad 10, where the bonded surface 10a is shown as an upper surface. The connection pad 10 may be a conductive layer having any optional shape such as a rectangular shape in a plan view shown in FIG. 3. The conductive layer serves as the connection pad 10. The conductive layer may be formed of a metal such as copper.

The first electrode 9 extends through a central portion of the connection pad 10 in a plan view, an upper end (a connection end) 9a of the first electrode 9 protrudes slightly upward from the bonded surface of the connection pad 10, and the upper end of the first electrode 9 is integrated with the connection pad 10.

Auxiliary electrodes 11 as counter electrodes having a shape similar to that of the first electrode 9 are formed at four locations around the first electrode 9 in a state in which they are surrounded by the first insulating layer 5. The four auxiliary electrodes 11 may have, but not limited to, a particular shape such as a generally columnar shape similar to that of the first electrode 9 from the top to the bottom thereof, but are not connected to the first circuit 8 on the lower portion thereof. The lower portion of the auxiliary electrode 11 is surrounded by the first insulating layer 5, and is not connected to an active region of the first substrate body 3 or the first circuit 8. Therefore, the auxiliary electrode 11 can be referred to as a floating electrode. The auxiliary electrode 11 does not necessarily have to be a floating electrode, and may be an electrode connected to a part of the first circuit 8.

The four auxiliary electrodes 11 are formed to surround the periphery of the first electrode 9 at positions close to a corner portion of the connection pad 10 having a rectangular shape in a plan view. As can be understood with reference to FIG. 3, when the first electrode 9 is seen in a plan view, and the first electrode 9 is set as a center position, the auxiliary electrodes 11 are evenly arranged at 90 degree intervals in a circumferential direction thereof.

Figure 3:
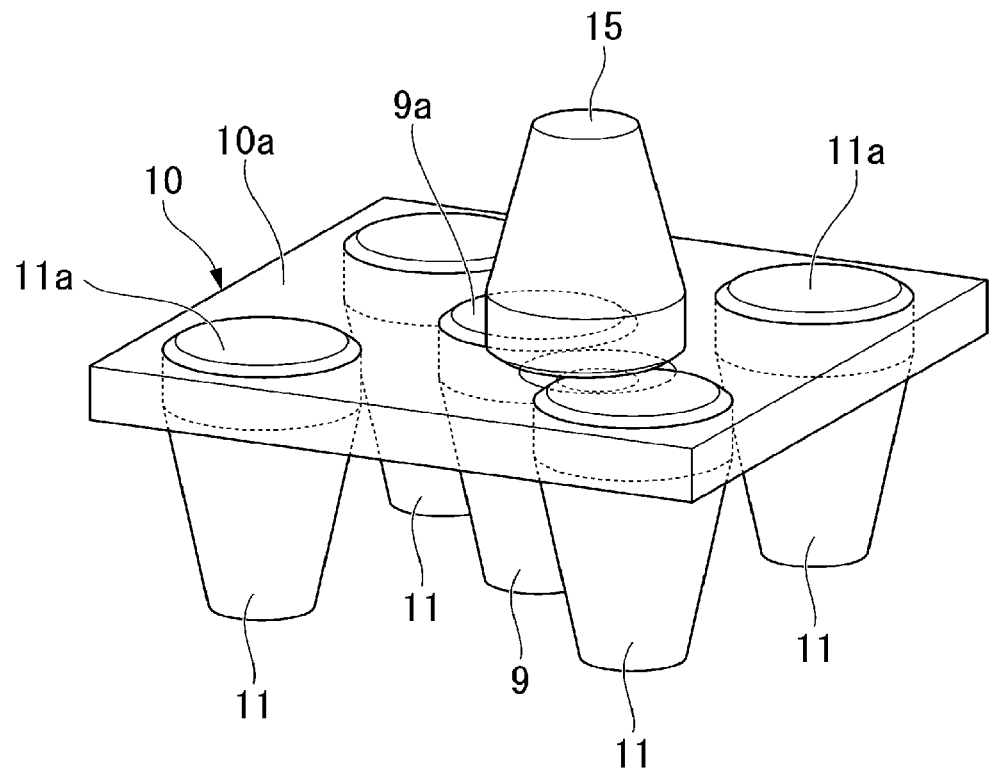
FIG. 3 is a schematic perspective view of a partial cross section of the bonding portion shown in FIG. 2.

As shown in FIGS. 1 to 3, all or part of the first electrode 9 and the auxiliary electrodes 11 may have, but not limited to, a particular shape such as a generally columnar shape but a downwardly-slightly-tapered shape, wherein dimensions in horizontal directions are reduced slightly decreased. The shapes of the electrodes 9 and 11 are not limited in particular shapes, and may have a columnar shape having a uniform dimension from the upper end to the lower end thereof, or may be a shape having a portion having a different diameter at a part or a plurality of places in a length direction.

A plurality of second circuits (memory circuits) 13 having storage elements such as memory cells and a plurality of columnar second electrodes 15 such as conductive vias connected to the second circuit 13 are provided on the inner side of the second insulating layer 7 in the second substrate 2. A plurality of second circuits 13 are provided on the second substrate 2 at predetermined intervals, but FIG. 1 shows only two left and right second circuits 13 as a representative example.

The second electrode 15 is disposed to pass through the second insulating layer 7 in the thickness direction (the —Z direction) of the second insulating layer 7 from a connection position with the second circuit 13. A lower end (a connection end) 15a of the second electrode 15 extends to a lower surface (the bonded surface S) of the second insulating layer 7.

As shown in FIGS. 1 and 2, the second electrode 15 is formed in a columnar shape in which the lower end thereof is enlarged in a sectorial shape. In the second electrode 15, the connection end 15a on the lower surface (the bonded surface S) of the second insulating layer 7 is formed to be substantially flush with the bonded surface S.

The shape of the second electrode 15 is not particularly limited, and may be a columnar shape having a uniform thickness from an upper end to a lower end thereof, or may be a shape having a portion having a different diameter at a part or a plurality of places in a length direction. The second electrode 15 is formed of, for example, a metal material such as copper.

The second circuit 13 includes, for example, a word line formed of a laminated body of a plurality of plate-shaped electrodes, and a plurality of columnar electrodes which pass through the laminated body. For example, the second circuit 13 in which a charge storage layer, a barrier film, a tunnel insulating film, a bit line, and the like are disposed at a portion in which the columnar electrode passes through the word line to form a three-dimensional NAND structure is formed.

The second electrode 15 connected to any one of these lines is provided on the second substrate 2. Although a plurality of second electrodes 15 are actually connected to the second circuit 13 shown in FIG. 1, in FIG. 1, only one second electrode 15 is represented, and indication of the other electrodes is omitted.

In a bonded structure shown in FIG. 1, the second insulating layer 7 of the second substrate 2 is bonded on the insulating layer 5 of the first substrate 1 via the bonded surface S. An upper surface of the insulating layer 5 of the first substrate 1 can be referred to as a first bonded surface S1, and a lower surface of the second insulating layer 7 of the second substrate 2 can be referred to as a second bonded surface S2.

As enlarged and shown in FIG. 2, the second electrode 15 is disposed above a position between the first electrode 9 and the auxiliary electrode 11 on the right side thereof. Further, a left end edge portion 15b shown in the cross section of FIG. 2 is in direct contact with the first electrode 9 and forms a direct connection DC1 on the connection end 15a of the second electrode 15 which faces the bonded surface S. Further, a right end edge portion 15b shown in the cross section of FIG. 2 is in direct contact with the auxiliary electrode 11 and forms an auxiliary connection DC2. Therefore, the second electrode 15 is electrically connected to the first electrode 9 and the auxiliary electrode 11 via the direct connection DC1 and the auxiliary connection DC2.

As shown in the cross section of FIG. 2, a connection end 9a of the first electrode 9 slightly protrudes toward the second substrate 2 with respect to the bonded surface S, and a connection end 11a of the auxiliary electrode 11 also slightly protrudes toward the second substrate 2 with respect to the bonded surface S.

Since the connection end 9a of the first electrode 9 slightly protrudes toward the substrate 2 with respect to the bonded surface S, the connection end 9a of the first electrode 9 is integrated with the second electrode 15 to partially include the end edge portion 15b of the second electrode 15 in the direct connection DC1. Similarly, the connection end 11a of the auxiliary electrode 11 is integrated with the second electrode 15 to partially include the end edge portion 15b of the second electrode 15 in the auxiliary connection DC2.

In other words, the second electrode 15 has a structure in which it is connected to the first electrode 9 via a side portion of the first electrode 9 located in the vicinity of the bonded surface S and is connected to the auxiliary electrode 11 and the connection pad 10 via a side portion of the auxiliary electrode 11 located near the bonded surface S.

In order to realize the structure shown in the cross section of FIG. 2, a minimum distance between the first electrode 9 and the auxiliary electrode 11 adjacent thereto is formed to be smaller than a diameter of the connection end 15a of the second electrode 15. In other words, the diameter of the connection end 15a of the second electrode 15 is formed to be larger than the minimum distance between the first electrode 9 and the auxiliary electrode 11 along the bonded surface S.

In the bonded structure shown in FIG. 2, a gap 20 due to having a recess on the insulating layer 5 is formed between the connection end 15a of the second electrode 15 and the connection pad 10. In this example, the gap 20 is formed to have a size exceeding half the diameter of the connection end 15a of the second electrode 15. The gap 20 will be described below.

In a structure in which the first substrate (the circuit substrate) 1 and the second substrate (the array substrate) 2 are bonded together, when an alignment at the time of bonding is accurate, the second electrode 15 of the second substrate 2 comes into direct contact with the first electrode 9 of the first substrate 1 and these are connected to each other.

However, when the alignment of the first substrate 1 and the second substrate 2 are slightly misaligned, the first electrode 9 and the second electrode 15 are misaligned in a plane direction of the bonded surface S.

In a manufacturing process of a present 3D memory, or the like, for the purpose of realizing a bonded structure without a gap, the bonded surface S of the bonded substrate is polished to be a smooth surface by a precision polishing technique such as chemical mechanical polishing (CMP). At present, the bonded surface S is finished to be a smooth surface with nano-order accuracy by this precision polishing technology. For example, assuming that a 300 mm wafer is used in the current technology, unevenness and waviness of the bonded surface are polished off with a goal of polishing with a nano-order accuracy such as 5 to 10 nm or less. Even when precision polishing is performed, fine recesses due to voids, dishing, or the like may be formed on the bonded surface S.

Figure 4:
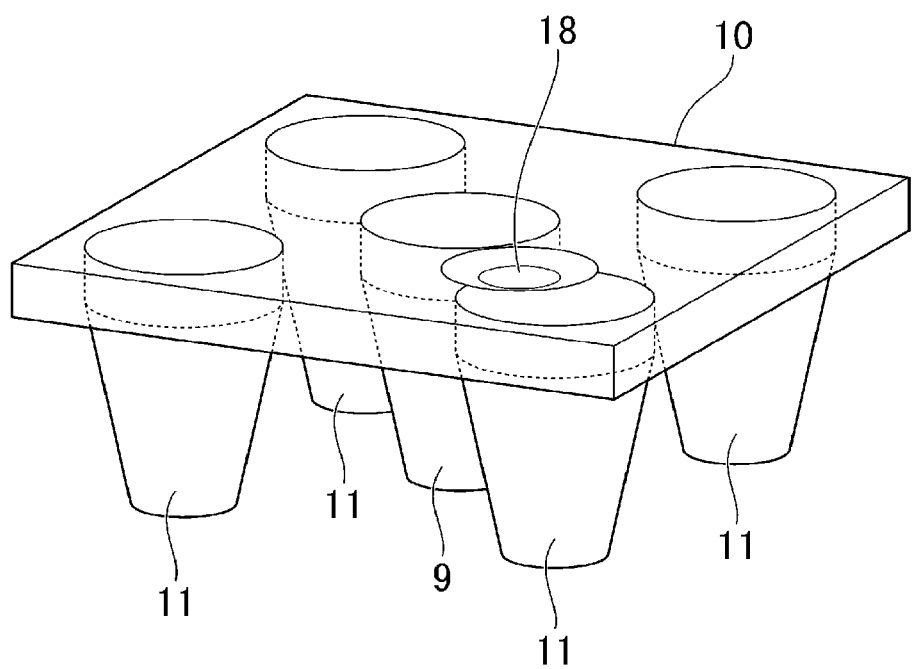
FIG. 4 is a schematic perspective view of a partial cross section showing the bonding portion of the first substrate.

In the structure shown in FIG. 2, as shown in FIG. 4, it is assumed that the first substrate 1 is bonded in a state in which a recess 18 is formed on the upper surface of the connection pad 10 which is above a position between the first electrode 9 and the auxiliary electrode 11. Further, a size of the connection pad 10 is assumed to have one side or a diameter of about 300 to 1000 nm, and a size of the auxiliary electrode 11 is assumed to have one side or a diameter of about 100 to 200 nm. A length of the auxiliary electrode 11 (a length in the Z direction) is assumed to be about 100 to 1000 nm.

In order to align the second substrate 2 with respect to the first substrate 1 having the structure shown in FIG. 4 to form the bonded substrate, an annealing process is performed. In the annealing process, the bonded surface S2 of the second substrate 2 comes into contact with the bonded surface S1 of the first substrate 1 while they are aligned with each other, and then both of them are kept at a temperature of about 300° C. to 400° C. for about several tens of minutes to several hours (for example, 60 minutes).

The columnar first electrode 9, auxiliary electrode 11, and second electrode 15 are respectively slightly elongated by thermal expansion in a length direction thereof due to heating during the annealing process. As a result, the extended first electrode 9, auxiliary electrode 11, and second electrode 15 are bonded while being surely in contact with each other. When the annealing process is completed and then they are cooled to room temperature, the elongated first electrode 9, auxiliary electrode 11, and second electrode 15 try to return to their original lengths before the annealing process, but the connection portions (the direct connection DC1 and the auxiliary connection DC2) between the electrodes generated during the annealing process are maintained in a connected state without being separated.

Therefore, as shown in the partially enlarged view of FIG. 2, a structure in which the connection end 9a of the first electrode 9 and the connection end 11a of the auxiliary electrode 11 are both integrated with the end edge portion 15b of the second electrode 15 is obtained. Considering a coefficient of thermal expansion of copper, it is known that a length of a columnar body of copper is elongated by about 16.8 nm per 10 μm. Therefore, assuming that the length of the first electrode 9 is about 0.5 to 1 μm, it can be estimated that the first electrode 9 is elongated by about several nm. Therefore, when the bonded surface S is chemically mechanically polished with nano-order accuracy, the structure shown in FIG. 2 can be realized.

As shown in FIG. 2, it can be determined that the structure in which both the connection end 9a of the first electrode 9 and the connection end 11a of the auxiliary electrode 11 are connected integrally to the end edge portion 15b of the second electrode 15 is connected in a good conduction state. In the structure shown in FIG. 2, although the gap 20 is formed along the bonded surface S, connection failure due to the presence of the gap 20 is unlikely to occur, and the connection end 9a of the first electrode 9 and the connection end 11a of the auxiliary electrode 11 can be connected to the second electrode 15 in a good conduction state.

The structure in which the connection end 9a of the first electrode 9 is integrated with the connection end 15a of the second electrode 15 can be referred to as a structure in which the connection end 9a of the first electrode (the conductive via) 9 is integrated with the side of the second electrode (the conductive via) 15 in the vicinity of the bonded surface S. With such a structure, good connection between the first electrode 9 and the second electrode 15 can be realized.

The structure in which the connection end 11a of the auxiliary electrode 11 is integrated with the end edge portion 15b of the second electrode 15 can be referred to as a structure in which the connection end 11a of the auxiliary electrode (the conductive via) 11 is integrated with the side of the second electrode (the conductive via) 15 in the vicinity of the bonded surface. With such a structure, good connection between the auxiliary electrode 11 and the second electrode 15 can be realized.

Therefore, when the semiconductor device 100 is a three-dimensional memory in which a circuit substrate (the first substrate) 1 and an array substrate (the second substrate) 2 are bonded together, the storage element can be driven while a control signal is reliably transmitted from the control circuit provided on the circuit substrate 1 to the storage element provided on the array substrate 2. Therefore, the semiconductor device 100 having the bonded structure shown in FIGS. 1 and 2 does not cause deterioration of electrical characteristics due to the bonded structure.

In the semiconductor device 100 shown in FIG. 1, the structure in which the auxiliary electrode 11 is provided on the circuit substrate 1 is adopted, but a structure in which the auxiliary electrode 11 is provided on the array substrate 2 may also be adopted as shown in an embodiment which will be described later. However, when comparing the circuit substrate 1 on which the circuit for driving the storage element is provided and the array substrate 2 on which the storage element is provided, generally, the array substrate 2 has a larger number of wires, and the structure of the storage element itself is more integrated than that of a driving element such as CMOS.

Therefore, when the insulating layer 5 and the insulating layer 7 are compared, the insulating layer 5 includes more regions which can be used as electrodes than in the insulating layer 7. Therefore, when the auxiliary electrode 11 is provided, it is preferable to provide the auxiliary electrode 11 on the circuit substrate 1 rather than on the array substrate 2 in terms of effective use of space.

"Method for Manufacturing Semiconductor Device"

Figure 5:
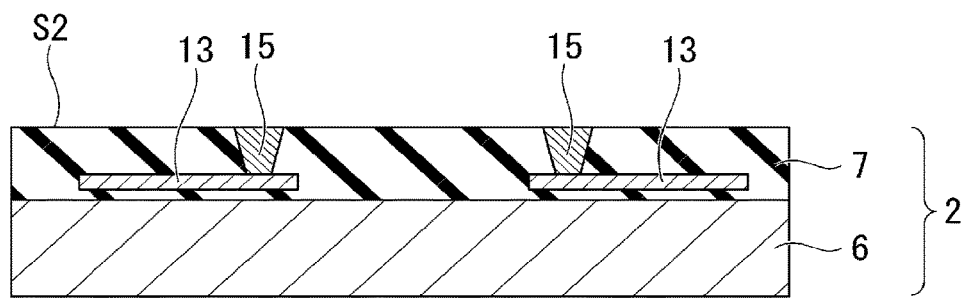
FIG. 5 is a partial cross-sectional view showing the second substrate.
Figure 6:
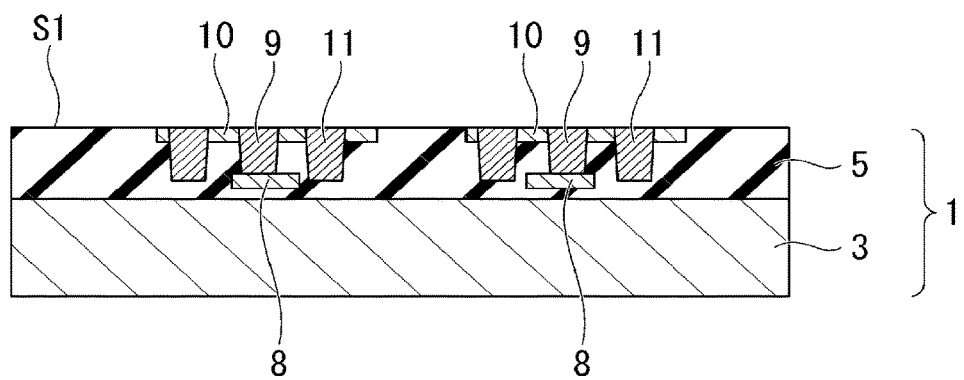
FIG. 6 is a partial cross-sectional view showing the first substrate.

When the semiconductor device 100 having the structures shown in FIGS. 1 to 3 is manufactured, for example, a manufacturing process of the first substrate 1 and a manufacturing process of the second substrate 2 are carried out separately to manufacture the second substrate 2 having the structure shown in FIG. 5 and the first substrate 1 having the structure shown in FIG. 6. In the manufacturing process of the first substrate 1 and the manufacturing process of the second substrate 2, an upper surface of the insulating layer 5 of the first substrate 1 and an upper surface of the insulating layer 7 of the second substrate 2 are subjected to chemical mechanical polishing so that smoothness of the upper surface of the insulating layer of each of the substrates is sufficiently enhanced. For example, it is preferable to control waviness and unevenness with nano-order.

Figure 7:
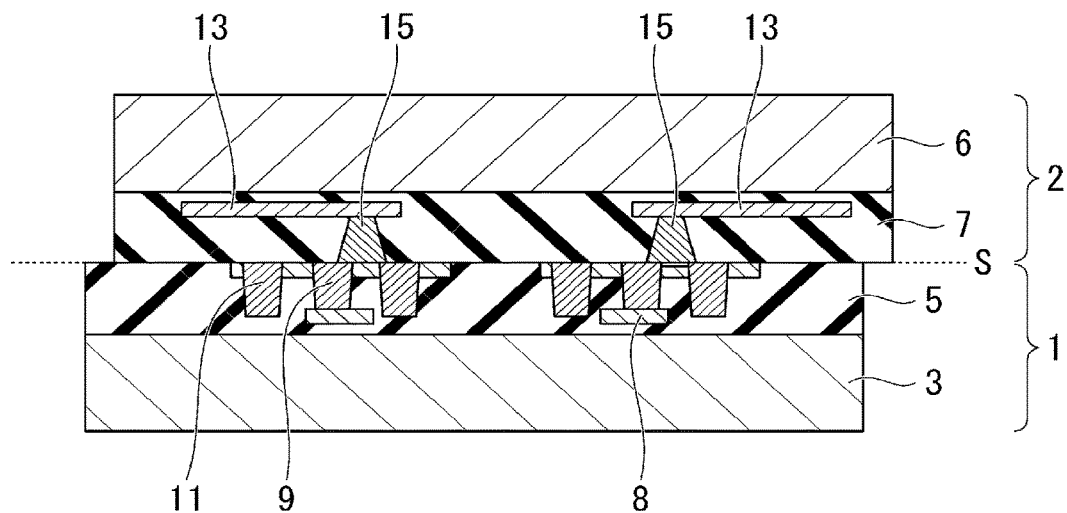
FIG. 7 is a partial cross-sectional view showing a state in which the first substrate and the second substrate are bonded to each other via the bonded surface.

Next, as shown in FIG. 7, the first substrate 1 and the second substrate 2 overlap each other while they are aligned with each other so that the insulating layer 7 of the second substrate 2 is overlapped on the insulating layer 5 of the first substrate 1. When the first substrate 1 and the second substrate 2 overlap each other, it does not matter which is on top.

When the first substrate 1 and the second substrate 2 overlap each other, although the alignment has been performed, when an error with micron-order is required for an electrode alignment system in a highly integrated three-dimensional memory, and the like, the substrates 1 and 2 may overlap each other with a slight misalignment. Further, when the upper surface is chemically mechanically polished in the manufacturing process of the first substrate 1, the fine recess 18 as shown in FIG. 4 may be formed on the upper surface of the insulating layer 5 of the first substrate 1.

FIG. 7 shows a state in which the first substrate 1, in which the recess 18 is formed, and the second substrate 2 overlap with each other with a slight misalignment.

FIG. 7 shows a state in which an axial center of the first electrode 9 of the first substrate 1 and an axial center of the second electrode 15 of the second substrate overlap each other with misalignment in the plane direction of the bonded surface S. In the case shown in FIG. 7, the first substrate 1 and the second substrate 2 overlap each other with a slight misalignment so that the second electrode 15 of the second substrate 2 is located above between the first electrode 9 and the auxiliary electrode 11 of the first substrate 1. That is, in FIG. 7, the second substrate 2 overlaps the first substrate 1 in a state in which it is slightly misaligned to the right.

The first substrate 1 and second substrate 2 which overlap each other are heated to 300° C. to 400° C. for several tens of minutes, for example, about 60 minutes, and then cooled and annealed.

Here, since a coefficient of thermal expansion of a metal material such as copper constituting the first electrode 9, the auxiliary electrode 11, and the second electrode 15 is larger than the coefficient of thermal expansion of the insulating layers 5 and 7, the first electrode 9, the auxiliary electrode 11, and the second electrode 15 are slightly elongated in the length direction thereof, and are maintained at an annealing process temperature while they are elongated. Thus, as a result of the elongated first electrode 9 and auxiliary electrode 11 being surely in contact with the second electrode 15 and diffusion bonding due to element diffusion progressing at an interface therebetween, the elongated first electrode 9, auxiliary electrode 11, and second electrode 15 are bonded in a state in which they are in contact with each other.

Figure 8:
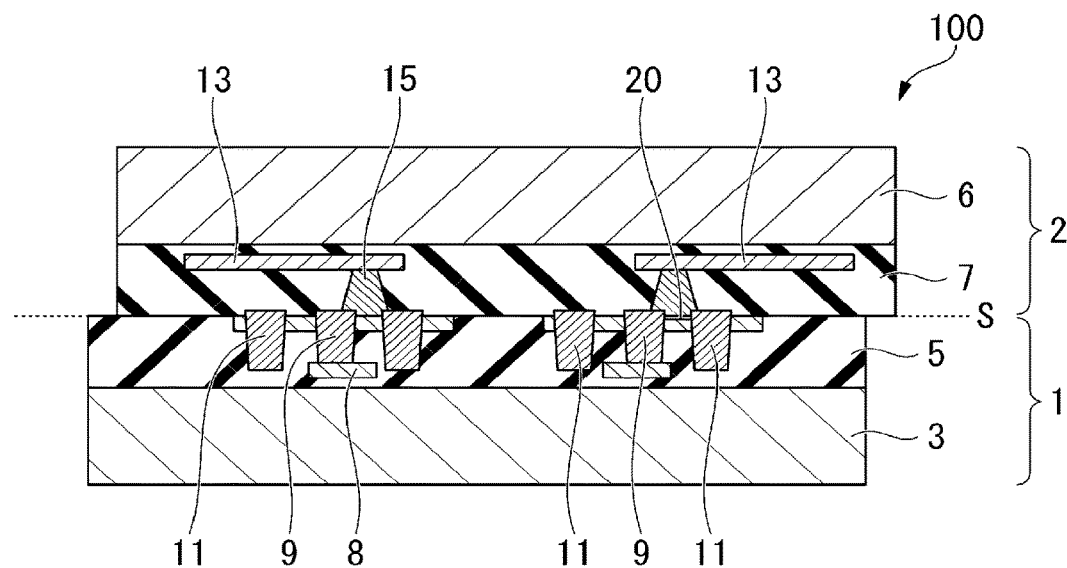
FIG. 8 is a partial cross-sectional view showing a state in which the first substrate and the second substrate in the state shown in FIG. 7 are annealed and the two substrates are bonded together.

As a result, as shown in FIG. 8, the semiconductor device 100 constituted of a bonded substrate having a structure equivalent to that shown in FIGS. 1 and 2 in which the first electrode 9, the auxiliary electrode 11 and the second electrode 15 are bonded can be obtained.

As shown in FIG. 7, when the substrates 1 and 2 overlap each other, the first electrode 9 and the second electrode 15 overlap each other with a slight misalignment in the plane direction of the bonded surface S. However, according to the structure of the present embodiment, the auxiliary electrode 11 is provided on the right side of the first electrode 9, and the auxiliary electrode 11 is connected to the first electrode 9 by the connection pad 10. Therefore, although the substrates 1 and 2 are slightly misaligned, the first electrode 9 can be reliably connected to the second electrode 15 also using the auxiliary electrode 11.

As can be understood from the cross section of FIG. 2, even when the second electrode 15 is misaligned further to the right side than in FIG. 2, the connection may be secured as long as the second electrode 15 is not misaligned to the right side from a right end of the right auxiliary electrode 11. Further, even when the second electrode 15 is misaligned further to the left side than in FIG. 2, conduction may be ensured as long as the second electrode 15 is not misaligned further to the left from a left end of the left auxiliary electrode 11.

In the structure shown in FIG. 2, as long as the second electrode 15 is not misaligned further outward from a mounting range of the four auxiliary electrodes 11 disposed around the first electrode 9 on the bonded surface S, a good connection between the first electrode 9 and the second electrode 15 can be ensured.

Therefore, according to the structure of the present embodiment, the misalignment between the first substrate 1 and the second substrate 2 can be absorbed, and a reliable connection between the first electrode 9 and the second electrode 15 can be ensured.

Figure 9:
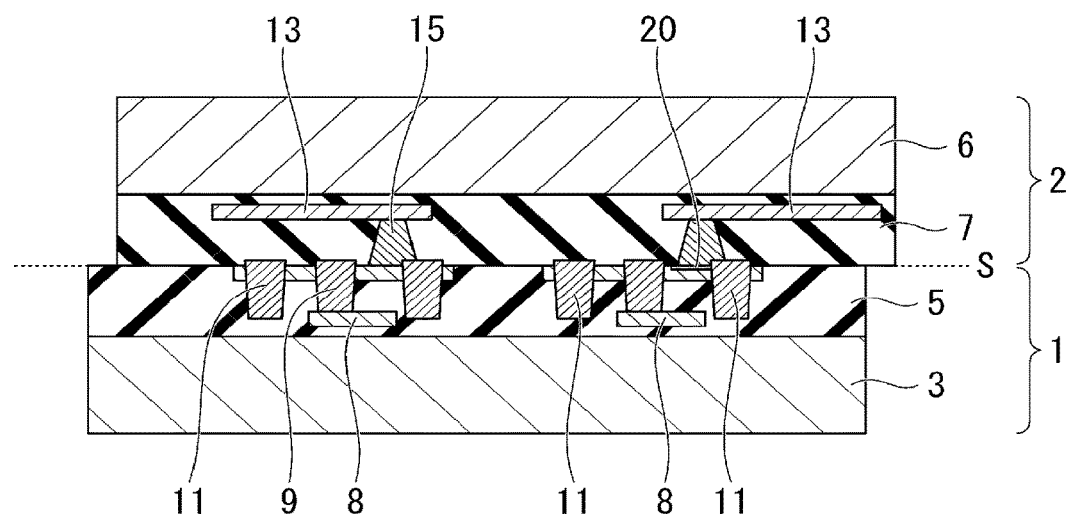
FIG. 9 is a partial cross-sectional view when an amount of misalignment between the first substrate and the second substrate is larger than that of a structure shown in FIG. 8.

FIG. 9 shows a partial cross section when an amount of misalignment between the first substrate 1 and the second substrate 2 is larger than that of the structure shown in FIG. 8. In the structure shown in FIG. 9, the second electrode 15 is not in direct contact with the first electrode 9, and is in direct contact with only the auxiliary electrode 11. This structure is a structure in which the first electrode 9 and the second electrode 15 are connected to form a third connection portion DC3 via the auxiliary electrode 11.

Since the auxiliary electrode 11 is connected to the first electrode 9 by the connection pad 10, the first electrode 9 and the second electrode 15 are connected while a good conduction state is maintained.

Second Embodiment

Figure 10:
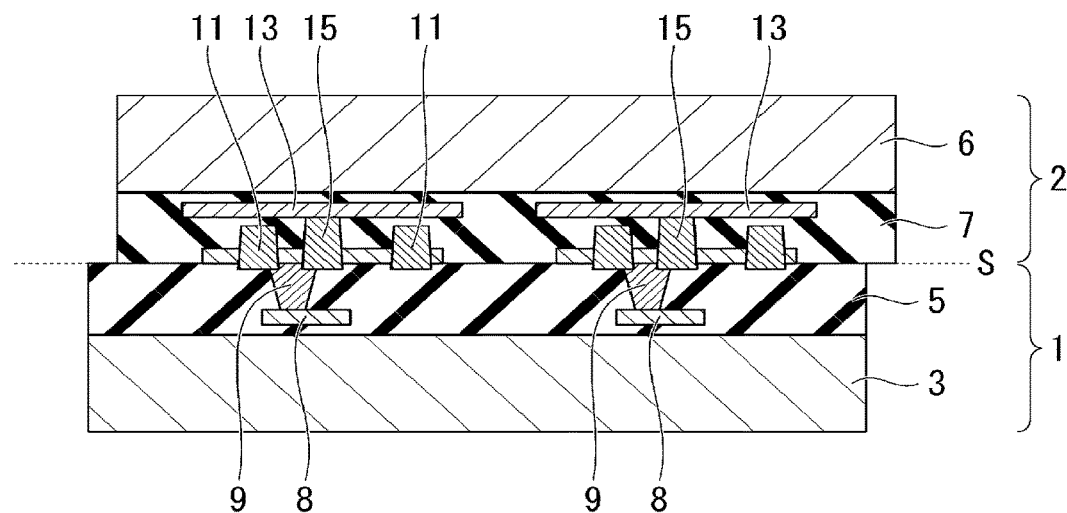
FIG. 10 is a partial cross-sectional view showing a semiconductor device including a bonded substrate constituted of a first substrate and a second substrate according to a second embodiment.

FIG. 10 shows a semiconductor device of a second embodiment in which only the first electrode 9 is provided on the first substrate 1, and the connection pad 10 and the four auxiliary electrodes 11 are provided around the second electrode 15 of the second substrate 2. The auxiliary electrode 11 may be provided in the second substrate 2 as shown in FIG. 10.

Further, although not shown, the auxiliary electrodes 11 may be provided in both the first substrate 1 and the second substrate 2. That is, a structure in which the connection pad 10 and the four auxiliary electrodes 11 are provided around the first electrode 9 of the first substrate 1, and the connection pad 10 and the four auxiliary electrodes 11 are provided around the second electrode 15 of the second substrate 2 may be adopted.

The number of auxiliary electrodes 11 to be provided should not be limited. Considering a space in the insulating layer for the auxiliary electrodes, proper number can be provided around the electrode to be connected.

Here, although the array substrate 2 is shown to have a second substrate body 6 in FIG. 10, the second substrate body 6 may be removed off to form the second substrate only with the second insulating layer 7.

Figure 11:
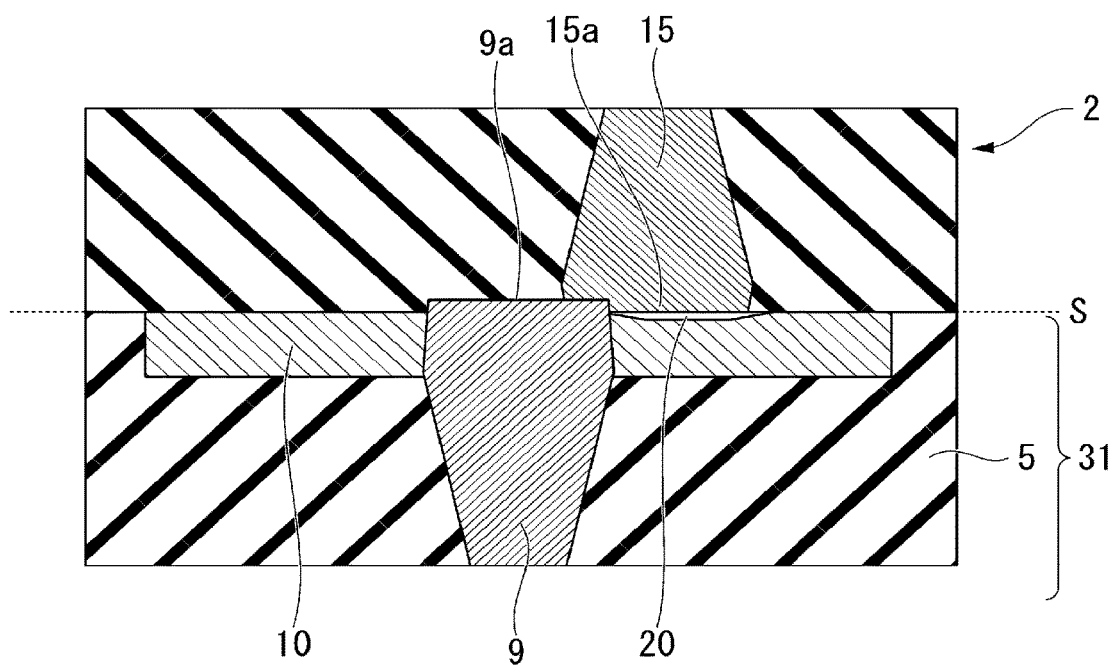
FIG. 11 is a partially enlarged cross-sectional view showing a bonding portion of a bonded substrate of a comparative example constituted of a first substrate and a second substrate.

FIG. 11 is a partially enlarged cross-sectional view assuming a structure of a comparative example in which the second substrate 2 having the second electrode 15 is bonded to a first substrate 31 having a structure in which the first electrode 9 and the connection pad 10 are provided and the auxiliary electrode 11 is not provided.

Figure 12:
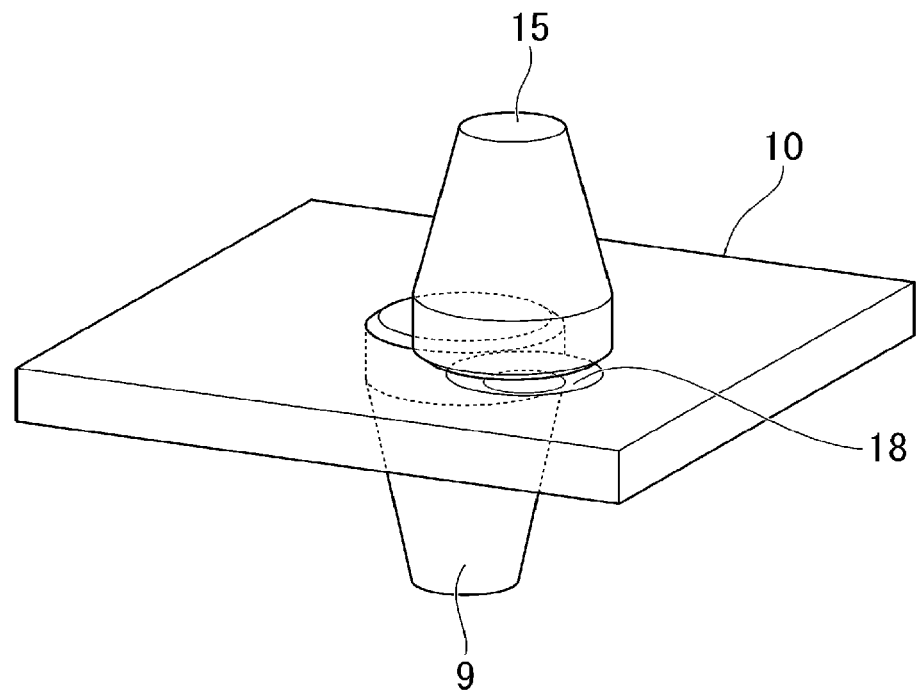
FIG. 12 is a schematic perspective view of a partial cross section showing the bonding portion of the comparative example shown in FIG. 11.
Figure 13:
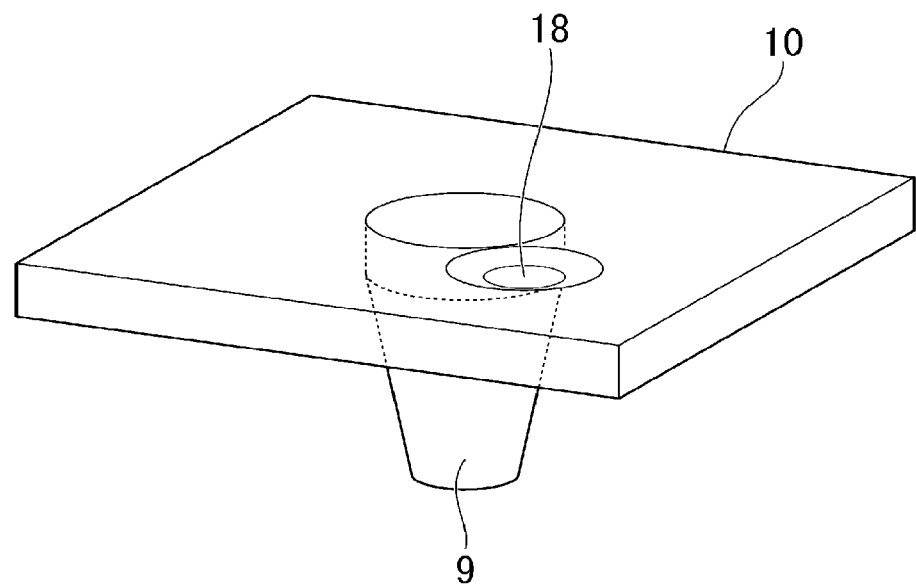
FIG. 13 is a schematic perspective view of a partial cross section showing the bonding portion of the first substrate in the bonded substrate of the comparative example.

In FIG. 11, it is assumed that the second electrode 15 is misaligned to the right with respect to the first electrode 9 as a case in which the recess 18 is formed in the insulating layer 5 and the connection pad 10 on the first substrate 31 in the vicinity of the first electrode 9, and the gap 20 is formed along the bonded surface S, as shown in FIGS. 12 and 13.

In the bonded structure shown in FIG. 11, the gap 20 having a size similar to that of the connection end 15a of the second electrode 15 is formed between the connection end 15a of the second electrode 15 and the connection pad 10 in a plan view. Therefore, it is considered that the conduction between the second electrode 15 and the connection pad 10 becomes insufficient. As shown in FIG. 11, the connection portion between the connection end 15a of the second electrode 15 and the connection end 9a of the first electrode 9 partially constitutes a direct connection portion, but and there is a high possibility that an area of the gap 20 may be large and the conduction may be insufficient. When the second substrate 2 is bonded so that the second electrode 15 is slightly misaligned to the right from a position shown in FIG. 11, the connection of the second electrode 15 is surely incomplete.

On the other hand, in the case in which the structure in which the auxiliary electrodes 11 shown in FIGS. 1 and 2 are provided, as described above, the influence of the misalignment when the first substrate 1 and the second substrate 2 are bonded can be clearly mitigated.

"Manufacturing Method in Structure of Comparative Example Shown in FIG. 11"

Figure 14:
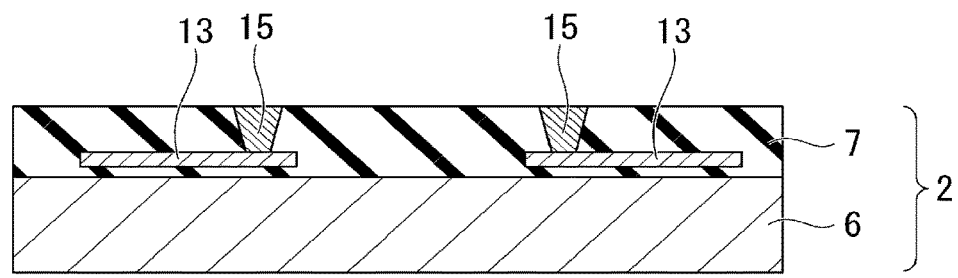
FIG. 14 is a partial cross-sectional view showing the second substrate of the comparative example.
Figure 15:
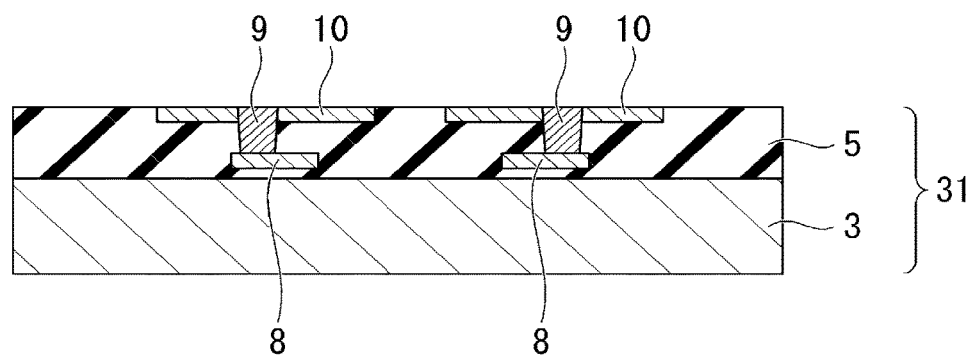
FIG. 15 is a partial cross-sectional view showing the first substrate of the comparative example.

When the structure shown in FIG. 11 is manufactured, as in the example described above, for example, the manufacturing process of the first substrate 31 and the manufacturing process of the second substrate 2 are carried out separately, and the second substrate 2 having the structure shown in FIG. 14 and the first substrate 31 having the structure shown in FIG. 15 are manufactured. In the manufacturing process of the first substrate 31 and the manufacturing process of the second substrate 2, the upper surface of the insulating layer 5 of the first substrate 31 and the upper surface of the insulating layer 7 of the second substrate 2 are subjected to chemical mechanical polishing to sufficiently improve the smoothness of the upper surfaces of the respective substrates.

Figure 16:
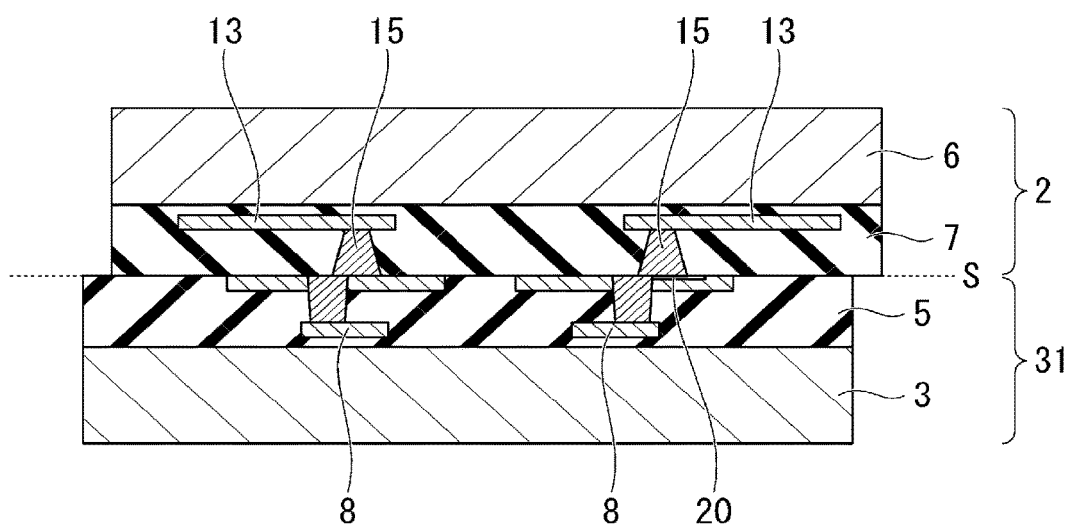
FIG. 16 is a partial cross-sectional view showing a state in which the first substrate and the second substrate of the comparative example are bonded to each other via a bonded surface.

Next, as shown in FIG. 16, the first substrate 31 and the second substrate 2 overlap each other while they are aligned with each other so that the insulating layer 7 of the second substrate 2 is overlapped on the insulating layer 5 of the first substrate 31.

When the first substrate 31 and the second substrate 2 overlap each other, although the alignment has been performed, when an error with micron-order is required for the electrode alignment system in a highly integrated three-dimensional memory or the like, the substrates 31 and 2 may overlap each other with a slight misalignment. Further, even when the upper surface is chemically polished in the manufacturing process of the first substrate 31, the fine recess may be formed on the upper surface of the insulating layer 5 of the first substrate 31.

FIG. 16 shows a state in which the first substrate 31 and the second substrate 2 on which the recess is formed overlap each other with a slight misalignment.

FIG. 16 shows a state in which the axial center of the first electrode 9 of the first substrate 31 and the axial center of the second electrode 15 of the second substrate overlap each other with a misalignment in the plane direction of the bonded surface S. In the case shown in FIG. 16, the first substrate 31 and the second substrate 2 overlap each other with a slight misalignment so that the second electrode 15 of the second substrate 2 is misaligned to the right from above the first electrode 9 of the first substrate 31.

Figure 17:
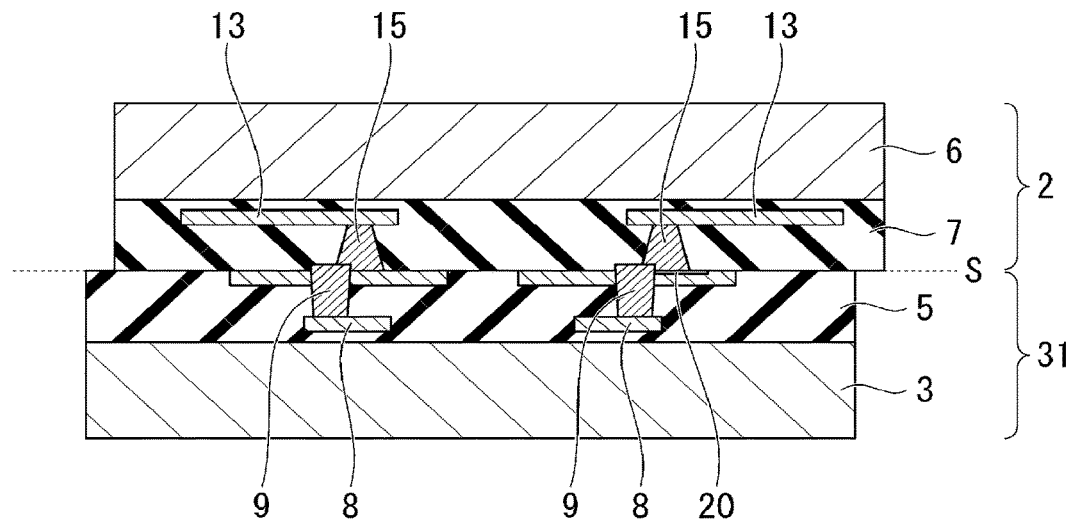
FIG. 17 is a partial cross-sectional view showing the bonded substrate in which the first substrate and the second substrate of the comparative example are bonded together.

When the first substrate 31 and the second substrate 2 which overlap each other in this way are annealed, a structure shown in FIG. 17 is obtained, the first electrode 9 and the second electrode 15 are in the state shown in FIG. 11 described above, and an electrode bonding portion may be incomplete.

Third Embodiment

FIGS. 18 to 21 are partially enlarged cross-sectional views showing an electrode bonding portion in a bonded substrate of a semiconductor device according to a third embodiment.

Figure 18:
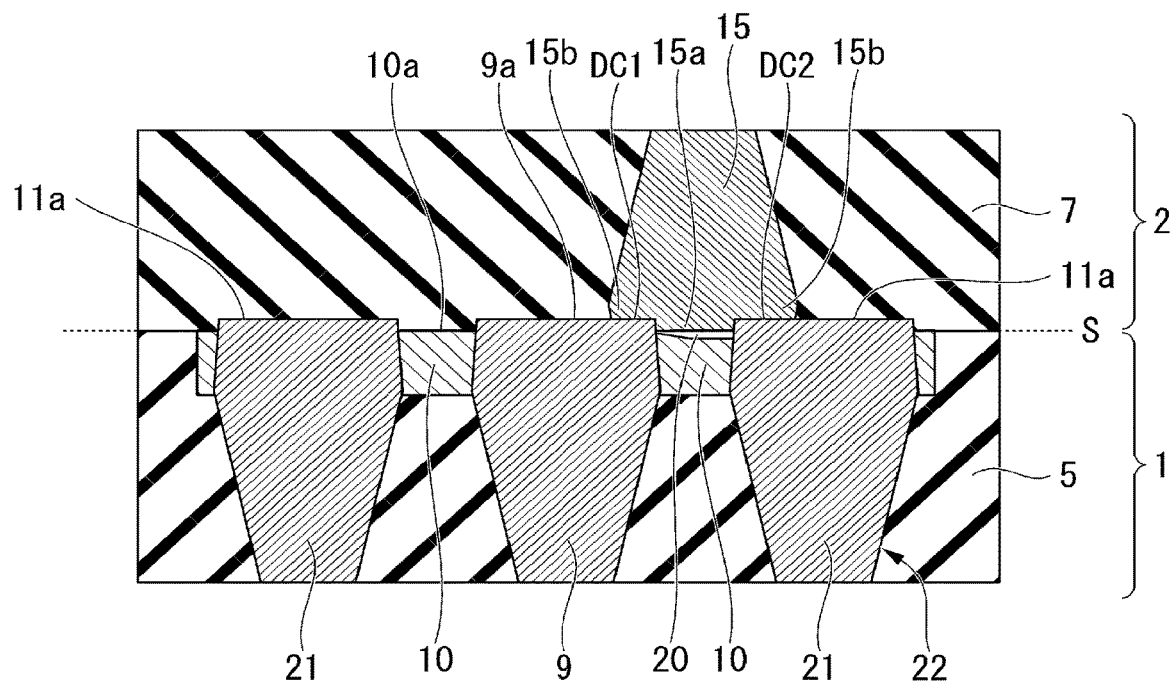
FIG. 18 is a partially enlarged cross-sectional view showing a semiconductor device including a bonded substrate constituted of a first substrate and a second substrate according to a third embodiment.

A connection structure shown in FIG. 18 shows a state in which the second substrate 2 is disposed on the first substrate 1 in the same manner as the connection structure shown in FIG. 2.

The structure in which the first substrate 1 has the first insulating layer 5 and the first electrode 9 is formed and the first electrode 9 is connected to the first circuit 8 is the same as that in the first embodiment.

Further, a basic structure of the second substrate 2 is the same as that in the first embodiment, and a point in which the connection end 15a of the second electrode 15 of the second substrate 2 is formed at a position at which it reaches the bonded surface S is also equivalent. Further, an equivalent structure is also assumed in that the gap 20 is formed on the upper surface of the insulating layer 5 of the first substrate 1 and below the second electrode 15 of the second substrate 2.

In the third embodiment, a structure of the auxiliary electrode is different from the structure in the first embodiment. The auxiliary electrode 11 of the first embodiment has a columnar shape, and the four auxiliary electrodes 11 are disposed around the first electrode 9. On the other hand, in the structure of the second embodiment, a peripheral wall-shaped auxiliary electrode 22 in which four wall portions 21 are disposed to surround the periphery of the first electrode 9 is provided. Each of the four wall portions 21 is made of a metal material such as copper.

As an example, a height of the wall portion 21 is formed to be the same as a height (a length in the Z direction) of the columnar auxiliary electrode 11 used in the first embodiment. Further, since the auxiliary electrode 22 is formed to be embedded in the insulating layer 5, it can be expressed as a floating electrode like the auxiliary electrode 11 of the first embodiment. The auxiliary electrode 22 having such a shape can be formed by, for example, a dual damascene method or a damascene method which is known as a technique for forming an electrode in an insulating layer.

In this example, the four wall portions 21 constituting the auxiliary electrode 22 are disposed in a rectangular shape in a plan view, and the four wall portions 21 are disposed around the first electrode 9 at a predetermined distance from the first electrode 9. As an example, a position at which the four auxiliary electrodes 11 of the first embodiment are disposed corresponds to an intersection position between the adjacent wall portions 21 and 21 in the present embodiment.

The structure is similar to that of the first embodiment in that the plurality of first circuits 8 on which driving elements such as transistors are provided are provided on the first substrate 1 of the second embodiment and that of the first embodiment in that the plurality of second circuits 13 having a storage element such as a memory cell array are provided on the second substrate 2.

As shown in FIG. 18, the structure is similar to that of the first embodiment in that the gap 20 is formed along the bonded surface S and that of the first embodiment in that the substrates 1 and 2 are bonded to each other so that the second electrode 15 is misaligned to the right with respect to the first electrode 9. The fact that the second insulating layer 7 of the second substrate 2 is bonded on the insulating layer 5 of the first substrate 1 via the bonded surface S is also similar.

In the case of the structure of the present embodiment, the left and right end edge portions 15*b* shown in a cross section of FIG. 18 are in direct contact with the first electrode 9 or the right wall portion 21 to form a direct connection DC1 and an auxiliary connection DC2 on the connection end 15*a* of the second electrode 15 which faces the bonded surface S.

Therefore, the second electrode 15 is electrically connected to the first electrode 9 and the auxiliary electrode 22 via the direct connection DC1 and the auxiliary connection DC2.

As shown in the cross section of FIG. 18, the connection end 9*a* of the first electrode 9 protrudes slightly toward the second substrate 2 further than the bonded surface S, and an upper end (a connection end) 21*a* of the wall portion 21 also protrudes slightly toward the second substrate 2 further than the bonded surface S.

Since the connection end 9*a* of the first electrode 9 slightly protrudes toward the substrate 2 further than the bonded surface S, the connection end 9*a* of the first electrode 9 is integrated with the second electrode 15 to partially include the connection end 15*a* of the second electrode 15 in the direct connection DC1. Similarly, the connection end 21*a* of the wall portion 21 is integrated with the second electrode 15 to partially include the connection end 15*a* of the second electrode 15 in the auxiliary connection DC2.

In order to realize the structure shown in the cross section of FIG. 18, a minimum distance between the first electrode 9 and the wall portion 21 adjacent thereto is formed to be smaller than a diameter of the connection end 15*a* of the second electrode 15. In other words, the diameter of the connection end 15*a* of the second electrode 15 is formed to be larger than the distance between the first electrode 9 and the wall portion 21 along the bonded surface S.

As shown in FIG. 18, the structure in which the connection end 9*a* of the first electrode 9 and the connection end 21*a* of the wall portion 21 are both integrated with the end edge portion 15*b* of the second electrode 15 is connected in a good conduction state. In the structure shown in FIG. 18, even when the gap 20 is formed along the bonded surface S, the connection failure due to the presence of the gap 20 is unlikely to occur, and the connection end 9*a* of the first electrode 9 and the connection end 21*a* of the wall portion 21 can be connected to the second electrode 15 with good conductivity.

As shown in FIG. 18, when the substrates 1 and 2 overlap each other, the first electrode 9 and the second electrode 15 overlap each other with a slight misalignment in the plane direction of the bonded surface S. However, according to the structure of the present embodiment, the wall portions 21 are provided around the first electrode 9, and the wall portions 21 are made conductive to the first electrode 9 by the connection pad 10. Therefore, even when the substrates 1 and 2 are slightly misaligned, the same effect as that of the structure of the first embodiment can be obtained in that the second electrode 15 can be reliably connected to the first electrode 9.

Also, as can be understood from the cross section of FIG. 18, even when the second electrode 15 is misaligned further to the right than in FIG. 18, there is a high possibility that the connection can be secured as long as the second electrode 15 is not misaligned to the right with respect to a right end of the right wall portion 21. Further, even when the second electrode 15 is misaligned further to the left side than in FIG. 18, there is a high possibility that the conduction can be ensured as long as the second electrode 15 is not misaligned further to the left with respect to a left end of the left auxiliary electrode 11.

In the structure shown in FIG. 18, the conduction between the first electrode 9 and the second electrode 15 can be reliably ensured as long as the second electrode 15 is not misaligned further outward from a mounting range of the four wall portions 21 disposed around the first electrode 9 on the bonded surface S.

Therefore, according to the structure of the present embodiment, it is possible to provide a structure in which the misalignment between the first substrate 1 and the second substrate 2 can be absorbed and the connection between the first electrode 9 and the second electrode 15 can be reliably secured.

Figure 19:
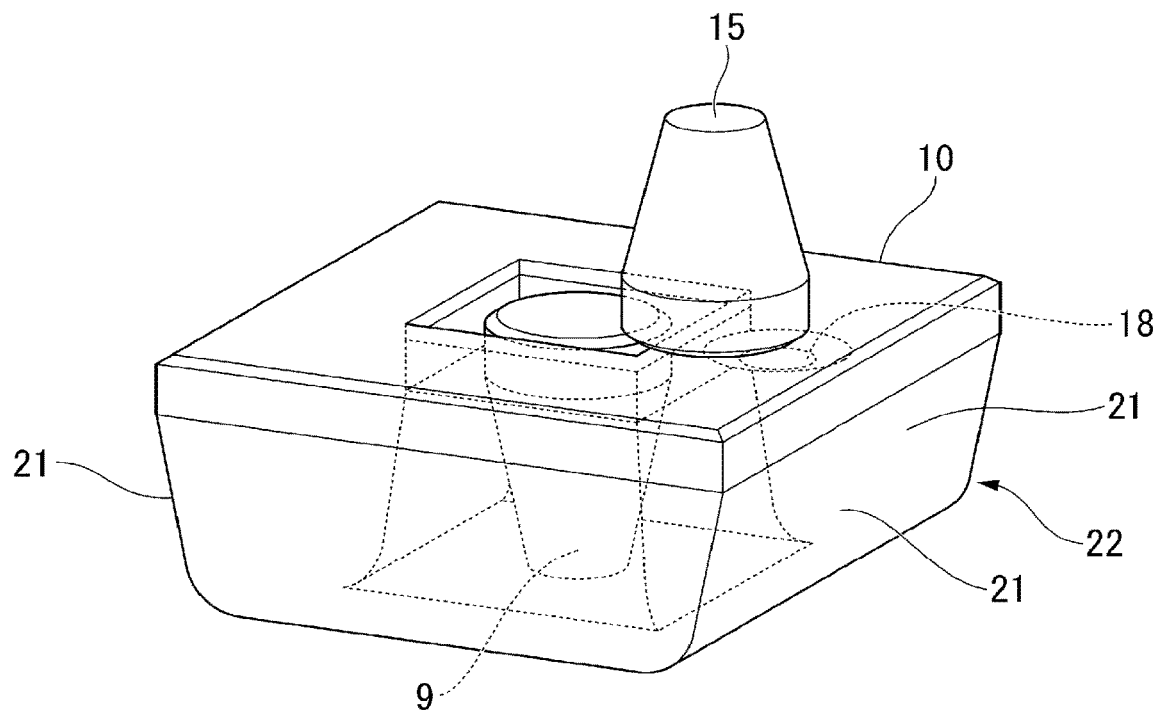
FIG. 19 is a schematic perspective view of a partial cross section showing a bonding portion of the semiconductor device according to the third embodiment.
Figure 20:
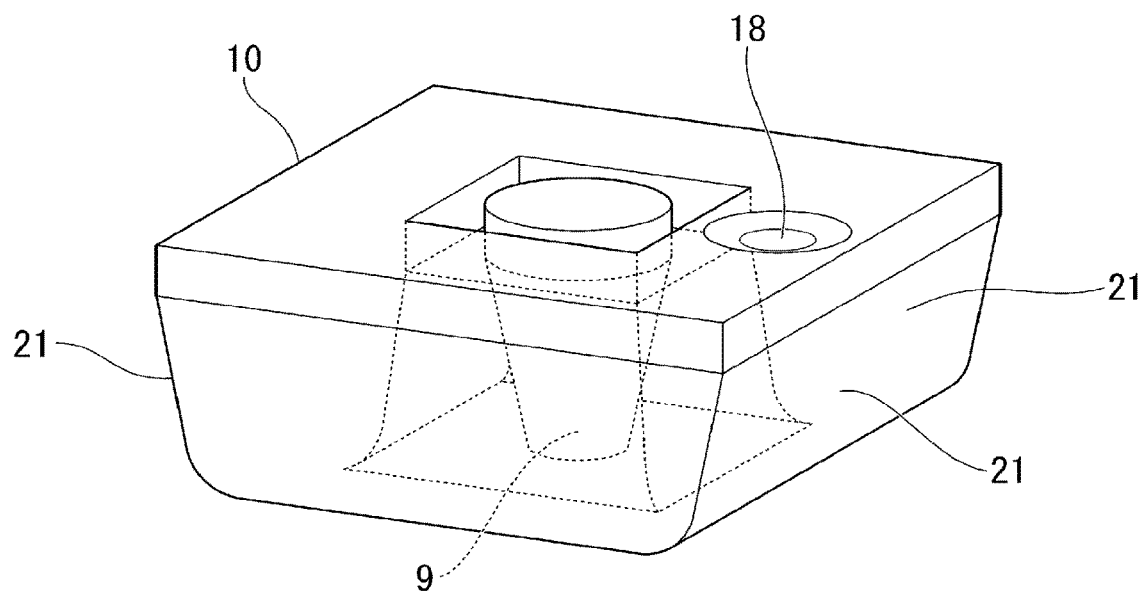
FIG. 20 is a schematic perspective view of a partial cross section showing the first substrate of the semiconductor device according to the third embodiment.

FIGS. 19 and 20 can be referred to as an example in which the peripheral wall-shaped auxiliary electrodes 22 having a rectangular shape in a plan view are disposed to surround a peripheral surface of the first electrode 9 with respect to a pair of electrode bonding portions shown in FIGS. 12 and 13.

Even when the second electrode 15 which faces the auxiliary electrode 22 is misaligned in the presence of the recess 18, the connection via the side surfaces of the second electrode 15 and the auxiliary electrode 22 can be realized, and the influence of misalignment can be mitigated.

Since the auxiliary electrodes 22 shown in FIGS. 18 and 19 surround the periphery of the first electrode 9, in the case of substrate bonding, even when the first substrate 1 and the second substrate 2 are misaligned in any direction along the bonded surface S, the influence of the misalignment can be mitigated.

Fourth Embodiment

Figure 21:
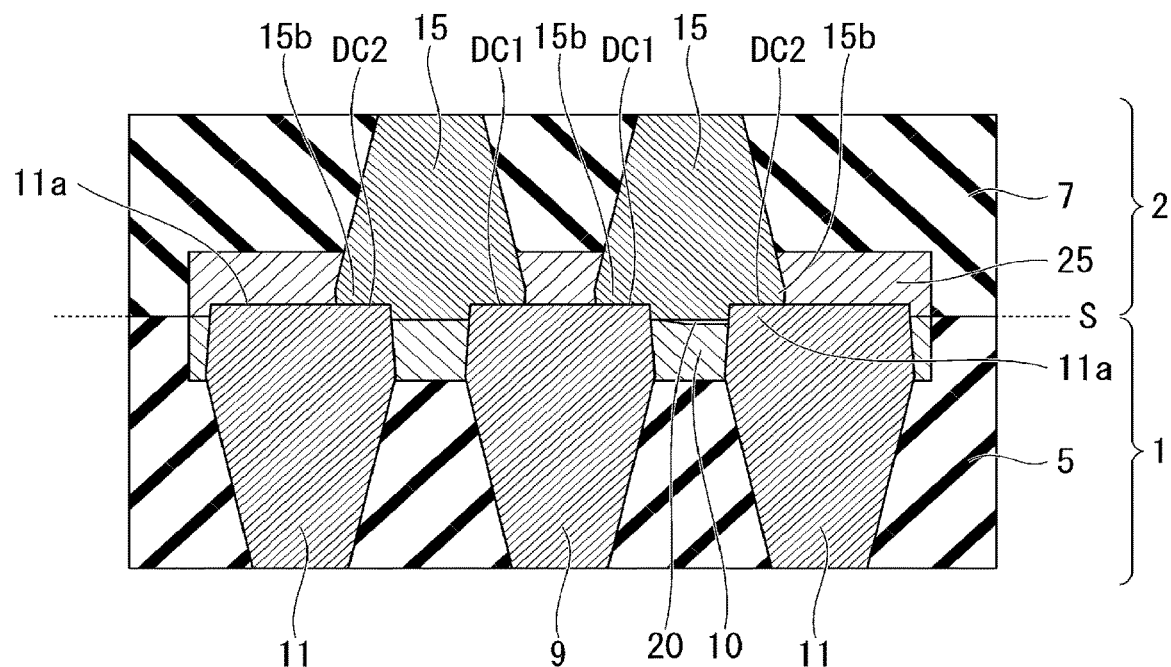
FIG. 21 is a partially enlarged cross-sectional view showing a semiconductor device including a bonded substrate constituted of a first substrate and a second substrate according to a fourth embodiment.
Figure 22:
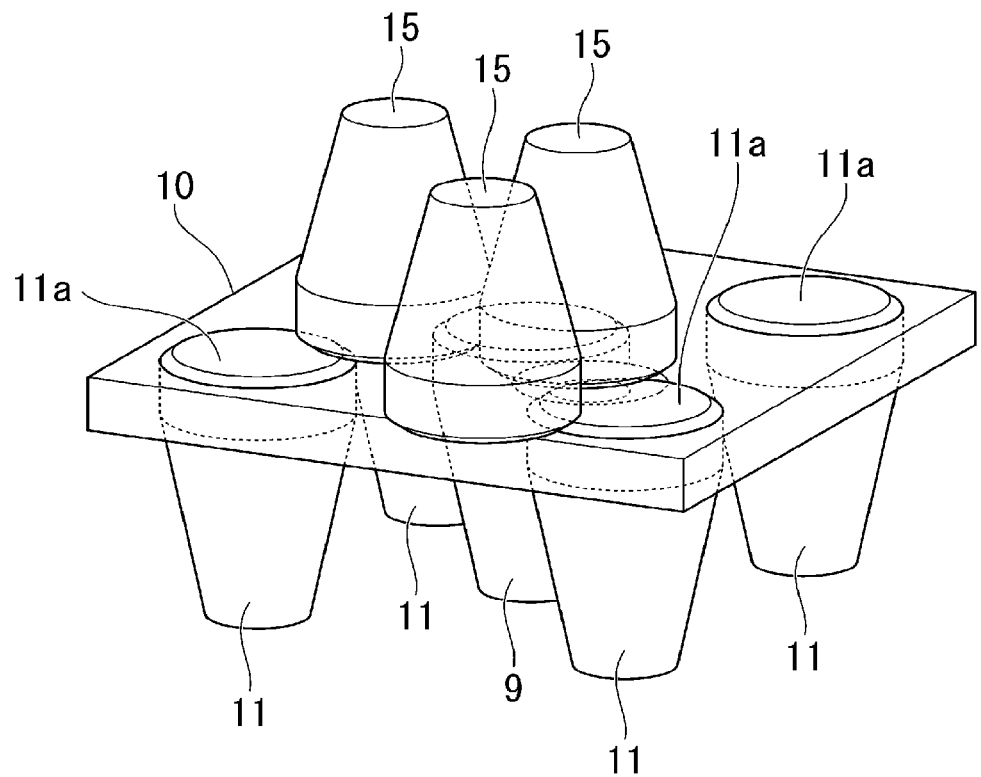
FIG. 22 is a schematic perspective view of a partial cross section showing a bonding portion of the semiconductor device according to the fourth embodiment.
Figure 23:
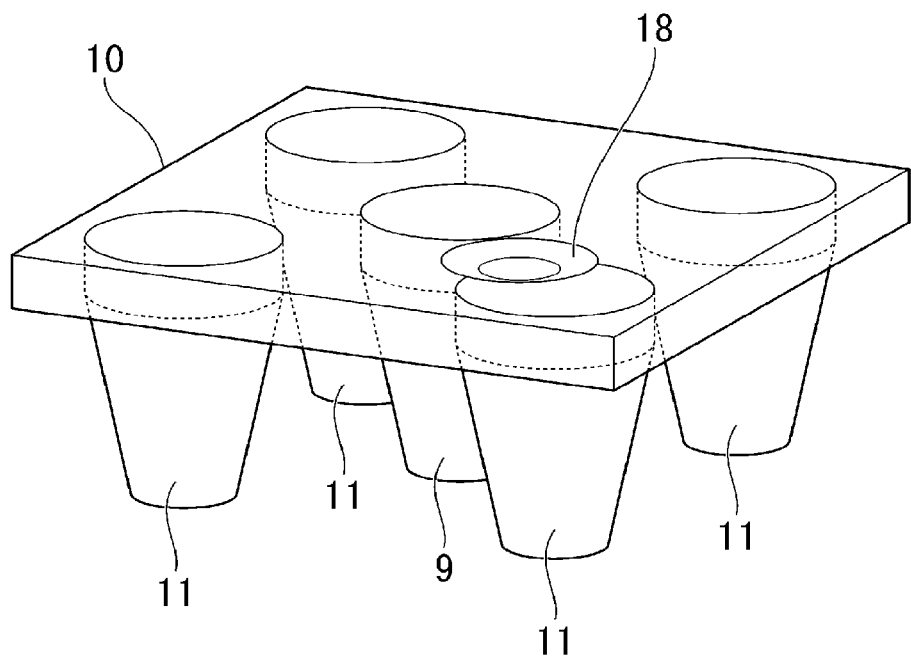
FIG. 23 is a schematic perspective view of a partial cross section showing the first substrate of the semiconductor device according to the fourth embodiment.

FIGS. 21 to 23 are partially enlarged cross-sectional views showing an electrode bonding portion in a bonded substrate of a semiconductor device according to a fourth embodiment.

The connection structure shown in FIG. 21 shows a state in which the second substrate 2 is bonded on the first substrate 1 in the same manner as the connection structure shown in FIG. 2.

The structure is similar to that of the first embodiment in that the first substrate 1 has the first insulating layer 5 and the first electrode 9 is formed and that the first electrode 9 is connected to the first circuit 8 and is also similar to that of the first embodiment in that the four columnar auxiliary electrodes 11 are provided.

Further, a basic structure of the second substrate 2 is the same as the structure of the first embodiment, and a point that the connection end 15*a* of the second electrode 15 of the second substrate 2 is formed at a position at which it faces the bonded surface S is also equivalent. Further, an equivalent structure is also assumed in that the gap 20 is formed on the upper surface of the insulating layer 5 of the first substrate 1 and below the second electrode 15 of the second substrate 2.

In the fourth embodiment, a structure is different from that of the first embodiment in that a plurality of second electrodes 15, for example, three second electrodes 15 are provided on the second substrate 2 and are connected by a connection pad 25.

In the structure of the fourth embodiment, when the first substrate 1 and the second substrate 2 are annealed for bonding, all the four columnar auxiliary electrodes 11 and the three second electrodes 15 are elongated in the length direction thereof. Since the four auxiliary electrodes 11 are provided on the first substrate 1 and the three second electrodes 15 are provided on the second substrate 2, there is a high possibility that the electrodes 11 and 15 are disposed alternately, as shown in FIG. 22. Therefore, the elongated first electrode 9 and four auxiliary electrodes 11 form connection portions with the elongated three second electrodes 15 through the sides thereof to be bonded to each other. That is, the adjacent electrodes are bonded to each other in a state in which the sides are integrated in the vicinity of the bonded surface S.

FIG. 23 shows a positional relationship between the first electrode 9 and the connection pad 10, and the auxiliary electrode 11 and the recess 18 before the annealing process of the bonded portion is performed.

The direct connection DC1 is formed where the connection end 9a of the first electrode 9 and the connection end 15a of the second electrode 15 are directly connected and unified with each other. The auxiliary connection DC2 is formed where the connection end 9a of the first electrode 9 and the connection end 11a of the auxiliary electrode 11 are directly connected and unified with each other. At the direct connection DC1 and the auxiliary connection DC2, the side surface the end portion of the first electrode 9 and the side surface the end of the second electrode 15 are directly connected and unified with each other. Therefore, in the structure of the fourth embodiment, when the first electrode 9 and the second electrode 15 are connected, a connection structure can be formed via the direct connection DC1 and the auxiliary connection DC2 having adequate conductivity.

With respect to the bonding portion of the pair of upper and lower electrodes described above with reference to FIGS. 19 and 20, the constitution shown in FIGS. 21 to 23 can be referred to as a constitution in which the plurality of auxiliary electrodes 11 are disposed to surround the first electrode 9.

Further, when a plurality of connection ends 15a of the second electrodes 15 which face each other are disposed, it is possible to realize connection on the side surfaces of the connection ends without a misalignment and thus to obtain is an advantageous arrangement constitution from the viewpoint of electrical resistance by shifting the connection end 15a from the connection end 9a of the first electrode 9 and the connection end 11a of the auxiliary electrode 11, which face each other, from a stage of semiconductor circuit design assumed in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising: a first substrate having a first surface, the first substrate including a first circuit, a first electrode having a first connection end on the first surface, and a first auxiliary electrode having a second connection end on the first surface, the first auxiliary electrode being around the first electrode, the first electrode being connected to the first circuit inside the first substrate, the first auxiliary electrode being connected to the first electrode inside the first substrate; and a second substrate having a second surface that is in contact with the first surface of the first substrate, the second substrate including a second circuit and a second electrode having a third connection end on the second surface, the second electrode being connected to the second circuit inside the second substrate; and wherein the third connection end of the second electrode is connected directly with the first connection end of the first electrode and the second connection end of the first auxiliary electrode, and the second electrode is connected directly with the first electrode and connected through the first auxiliary electrode to the first electrode.

2. The semiconductor device according to claim 1, wherein the first auxiliary electrode is a floating electrode.

3. The semiconductor device according to claim 1,
wherein the first substrate further includes a second auxiliary electrode having a fourth connection end on the first surface, the second auxiliary electrode is around the first electrode,
wherein the second substrate further includes a third electrode around the second electrode, the third electrode has a fifth connection end on the second surface,
wherein the fifth connection end of the third electrode is connected directly with the first connection end of the first electrode and the fourth connection end of the second auxiliary electrode, and the third electrode is connected directly with the first electrode and connected through the second auxiliary electrode to the first electrode.

4. The semiconductor device according to claim 1, wherein a spatial gap extends around the first electrode and at a boundary between the first surface of the first substrate and the second surface of the second substrate.

5. The semiconductor device according to claim 1, wherein the first substrate is a circuit substrate, and the first circuit includes a CMOS circuit, and the second substrate is an array substrate, and the second circuit includes a memory circuit.

6. A semiconductor device, comprising:
a first substrate having a first surface, the first substrate including a first circuit, a first electrode having a first connection portion extending from the first surface, and a first auxiliary electrode having a second connection portion extending from the first surface, the first auxiliary electrode being around the first electrode, the first electrode being connected to the first circuit inside the first substrate, the first auxiliary electrode being connected to the first electrode inside the first substrate; and
a second substrate having a second surface that is in contact with the first surface of the first substrate, the second substrate including a second circuit and a second electrode having a first connection end on the second surface, the second electrode being connected to the second circuit inside the second substrate; and wherein the second electrode of the second substrate is directly connected with the first connection portion and the second connection portion both extending from the first surface of the first substrate, and the second electrode is connected directly with the first electrode and connected through the first auxiliary electrode to the first electrode.

7. The semiconductor device according to claim 6, wherein the first connection portion has a first side and the second connection portion has a second side, the second electrode is connected directly with the first side and with the second side.

8. The semiconductor device according to claim 6, wherein the first auxiliary electrode is a floating electrode.

9. The semiconductor device according to claim 6,
wherein the first substrate further includes a second auxiliary electrode having a third connection portion extending from the first surface, the second auxiliary electrode is around the first electrode,
wherein the second substrate further includes a third electrode around the second electrode, the third electrode has a second connection end on the second surface,
wherein the second connection end of the third electrode is connected directly with the third connection portion and the first connection portion both extending from the first surface of the first substrate, and the third electrode is connected directly with the first electrode and connected through the second auxiliary electrode to the first electrode.

10. The semiconductor device according to claim 6, wherein a spatial gap extends around the first electrode and at a boundary between the first surface of the first substrate and the second surface of the second substrate.

11. The semiconductor device according to claim 6, wherein the first substrate is a circuit substrate, and the first circuit includes a CMOS circuit, and the second substrate is an array substrate, and the second circuit includes a memory circuit.

12. A method for manufacturing a semiconductor device, the method comprising:
forming a first circuit, a first electrode and a first auxiliary electrode in a first substrate having a first surface, the first electrode having a first connection end on the first surface, and the first auxiliary electrode having a second connection end on the first surface, the first auxiliary electrode being around the first electrode, the first electrode being connected to the first circuit inside the first substrate, the first auxiliary electrode being connected to the first electrode inside the first substrate;
forming a second circuit and a second electrode in a second substrate having a second surface, the second electrode having a third connection end on the second surface, the second electrode being connected to the second circuit inside the second substrate; and
bonding the first substrate and the second substrate together, to make the second surface of the second substrate into contact with the first surface of the first substrate, and to connect the third connection end of the second electrode directly with the first connection end of the first electrode and the second connection end of the first axially electrode, so that the second electrode is connected directly with the first electrode and connected through the first auxiliary electrode to the first electrode.

13. The method according to claim 12, wherein the first substrate is a circuit substrate, and the first circuit includes a CMOS circuit, and the second substrate is an array substrate, and the second circuit includes a memory circuit.

14. A method for manufacturing a semiconductor device, the method comprising:
forming a first circuit, a first electrode and a first auxiliary electrode in a first substrate having a first surface, the first electrode having a first connection portion extending from the first surface, the first auxiliary electrode having a second connection portion extending from the first surface, the first auxiliary electrode being around the first electrode, the first electrode being connected to the first circuit inside the first substrate, the first auxiliary electrode being connected to the first electrode inside the first substrate;
forming a second circuit and a second electrode in a second substrate having a second surface, the second electrode having a first connection end on the second surface, the second electrode being connected to the second circuit inside the second substrate; and
bonding the first substrate and the second substrate together, to connect the second electrode of the second substrate directly with the first connection portion and the second connection portion both extending from the first surface of the first substrate, the second electrode is connected directly with the first electrode and connected through the first auxiliary electrode to the first electrode.

15. The method according to claim 13, wherein the first connection portion has a first side, and the second connection portion has a second side, the second electrode is connected directly with the first side and with the second side.

16. The method according to claim 14, wherein the first substrate is a circuit substrate, and the first circuit includes a CMOS circuit, and the second substrate is an array substrate, and the second circuit includes a memory circuit.

* * * * *